United States Patent
Aono et al.

[11] Patent Number: 5,779,822
[45] Date of Patent: Jul. 14, 1998

[54] PRECIPITATION HARDENING TYPE SINGLE CRYSTAL AUSTENITIC STEEL

[75] Inventors: Yasuhisa Aono, Hitachi; Akira Yoshinari; Yasuo Kondo, both of Hitachinaka; Junya Kaneda, Hitachi; Hideyo Kodama; Takahiko Kato, both of Hitachinaka; Shigeo Hattori, Tokai-mura; Masahiko Arai, Hitachi, all of Japan

[73] Assignee: Hitachi, Ltd., Tokyo, Japan

[21] Appl. No.: 593,491

[22] Filed: Jan. 30, 1996

[30] Foreign Application Priority Data

Feb. 3, 1995 [JP] Japan ................... 7-016665

[51] Int. Cl.$^6$ .................................. C22C 38/40
[52] U.S. Cl. .................. 148/404; 148/327; 148/326
[58] Field of Search .................. 148/327, 326, 148/404

[56] References Cited

U.S. PATENT DOCUMENTS 3,723,193   3/1973   Reimann et al.

FOREIGN PATENT DOCUMENTS

| | | |
|---|---|---|
| 0332460 | 9/1989 | European Pat. Off. |
| 0447109 | 9/1991 | European Pat. Off. |
| 0616043 | 9/1994 | European Pat. Off. |
| 62-180038 | 8/1987 | Japan |

OTHER PUBLICATIONS

Soviet Physics Journal, vol. 34, No. 11, Gudzenko, L.N., Nov. 11, 1991, pp. 1000–1003.

Thermal Fatigue of Unirradiated and Neutron–Irradiated Steel and Alloys, vol. 74, No. 2, Belyaeva, L.A., Feb. 2, 1993 (Abstract only).

*Primary Examiner*—Deborah Yee
*Attorney, Agent, or Firm*—Antonelli, Terry, Stout & Kraus, LLP

[57] ABSTRACT

In order to provide an austenitic single crystal stainless steel having preferable stress corrosion cracking resistance, strength, and irradiation induced embrittlement resistance so as to extend the life of a nuclear reactor core structure, which is used under a high radiation dose environment, a method is employed, which comprises the steps of homogeneously dispersing carbides into a parent phase of the austenitic single crystal stainless steel by a two step solution heat treatment, and subsequently effecting an ageing heat treatment after rapid cooling for precipitating fine carbides. Austenitic single crystal stainless steel having preferable stress corrosion cracking resistance, strength, and irradiation induced embrittlement resistance can be provided, and the life of nuclear reactor core structure, which is used under a high radiation dose environment, can be extended.

9 Claims, 7 Drawing Sheets

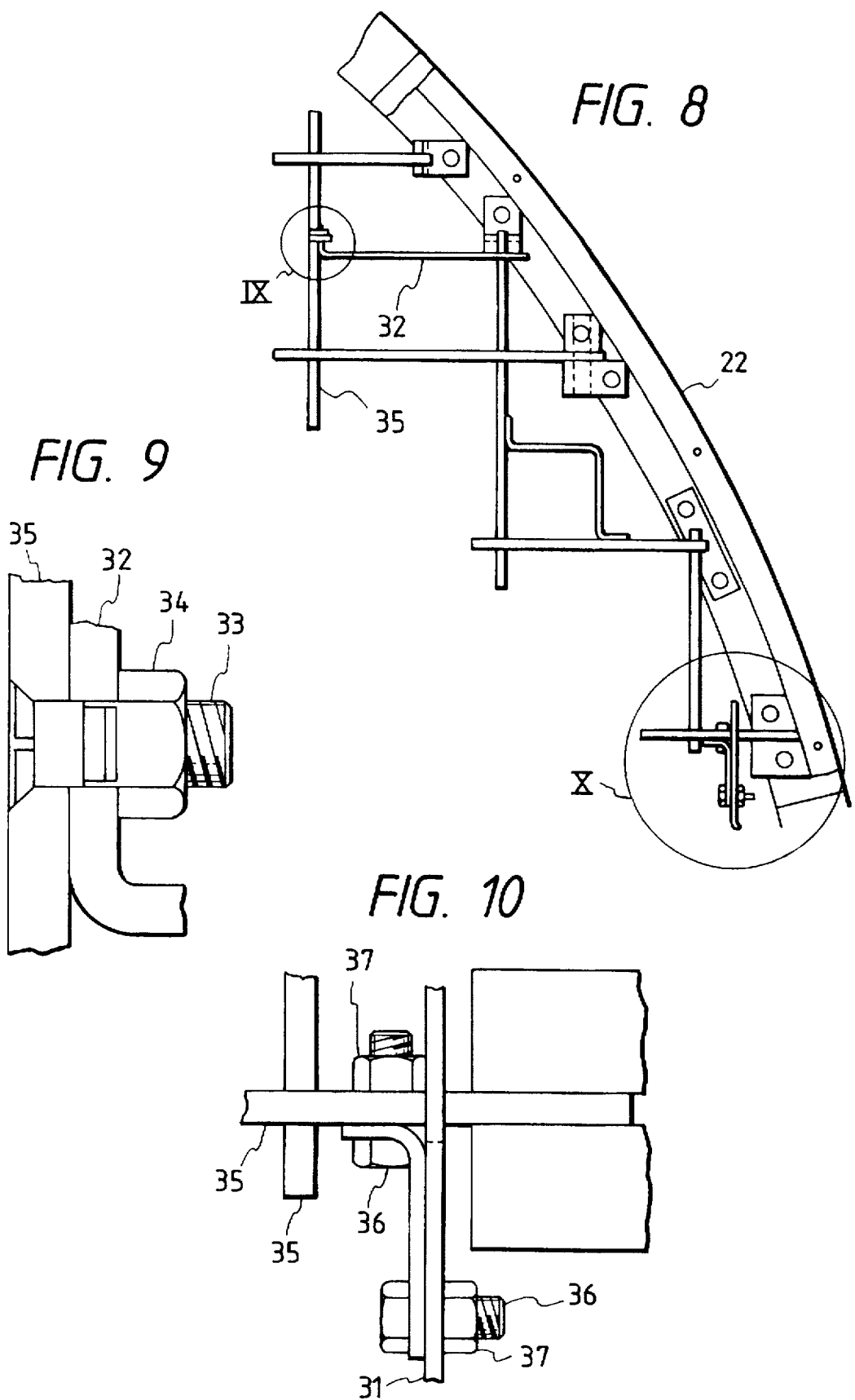

PRECIPITATION HARDENING TYPE SINGLE CRYSTAL AUSTENITIC STEEL

BACKGROUND OF THE INVENTION

The present invention relates to novel austenitic stainless steel, especially, to novel structural austenitic stainless steel preferable for use in a radiation irradiated environment, such as nuclear reactor cores and nuclear fusion reactors, and the usage of the same.

Austenitic stainless steel, especially the stainless steel having a high chromium-nickel composition, has been used as a material for structural members in nuclear reactors, because the stainless steel has a corrosion resistance in a corrosive environment in addition to having preferable properties as a structural material. However, a member made of austenitic steel in light water reactor cores becomes increasingly sensitive to Intergranular Stress Corrosion Cracking (IGSCC) with long time irradiation in use. For instance, a stainless steel having a solid solution state, obtained by solution heat treatment, has strong resistance to IGSCC outside the reactor core where no radiation damage is caused. However, the same material loses resistance to the IGSCC when it is irradiated with high level radiation, especially, radiation at more than $0.5 \times 10^{21}$ n/cm² in neutron dose, inside the reactor core. The IGSCC phenomenon, which is called Irradiation Accelerated Stress Corrosion Cracking (IASCC), has currently been deemed as a problem relating to aged nuclear reactors. As for the metallurgical mechanism of the IASCC phenomenon, two mechanisms of this phenomenon have been well known, including (1) atomic diffusion (irradiation induced diffusion), accompanied by a migration of voids which are generated by irradiation, causes a reduction in the concentration of chromium, a corrosion resistant element, in the vicinity of grain boundaries, and (2) impurity elements, such as P, S, si, and others, are segregated at grain boundaries, which reduces corrosion resistance at the grain boundaries.

As for a method for resolving the above described problems, JP-A-63-303038 (1988) discloses a method where the amount of composite elements of austenitic stainless steel, such as N, P, Si, S, C, Mn, Cr, and Ni, are adjusted, and traces of Ti and Nb are added to the austenitic stainless steel.

On the other hand, as for a method for preventing intergranular stress corrosion cracking, single crystallizing methods for eliminating grain boundaries, which form a network and are a source of the cracking, have been proposed. As for the single crystals, a single crystal steel of austenitic (γ) single phase having a crystalline structure of FCC structure, a single crystal steel of austenitic phase matrix including a small amount of ferritic (δ) phase having a crystalline structure of BCC structure, and a single crystal steel of a so-called two-phase stainless steel, wherein the (γ) phase is dispersed in a single crystal of α phase, are disclosed in JP-A-3-264651 (1991) and JP-A-62-180038 (1987).

However, the invention disclosed in JP-A-63-303038 (1988), wherein intergranular stress corrosion cracking is prevented by adjustment of the composition, can not prevent substantially all of the above described stress corrosion cracking generated by irradiation acceleration, because the material is polycrystalline stainless steel and its structure contains grain boundaries.

Furthermore, the Proposal disclosed in JP-A-3-264651 (1991) relates to a single crystal steel of γ single phase including steel with Ti, Nb added, a γ phase single crystal steel containing a small amount of δ phase, both of which steels are strengthened by a solid solution of alloy elements and have a lower yield strength than that of commercially available stainless steels, SUS 304 steel and SUS 316 steel. The Proposal disclosed in JP-A-62-180038 (1987) relates to a single crystal, of which the parent phase is composed of a α phase having a BCC structure. The α phase has been a source of concern as it is conceived to more readily cause irradiation embrittlement by irradiation damage than the γ phase.

SUMMARY OF THE INVENTION

An object of the present invention is to provide an austenitic stainless steel with a stable structure, a resistance to stress corrosion cracking, a preferable strength, and a resistance to irradiation embrittlement, for use in nuclear reactors having a preferably long life under such a high level radiation environment as is typical in a reactor core, and methods for repairing the same.

The present invention relates to a precipitation hardening type single crystal austenitic steel having a preferable resistance to stress corrosion cracking and to neutron irradiation composed of a parent phase with a chemical composition of:

Si: at most 1% by weight,

Mn: at most 2% by weight,

Ni: 9–21% by weight,

Cr: 14–20% by weight, unavoidable impurities in manufacturing of the steel: at most 0.5% by weight, and the balance being Fe, characterized by a parent phase that is composed of an austenitic phase including 0–10% by volume of ferritic phase at room temperature.

The austenitic phase has crystallinity of a single crystal, with composite carbides containing carbon elements in a range of 0.03–0.20% by weight, a part of the parent phase elements, and at least one of the added elements of Ti, Zr, V, Nb, and Ta is precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at room temperature.

Furthermore, the present invention relates to a precipitation hardening type single crystal austenitic steel with a preferable corrosion resistance composed of a parent phase with a chemical composition of:

at most 1% by weight,

Mn: at most 2% by weight,

Ni: 9–14% by weight,

Cr: 18–20% by weight, unavoidable impurities in manufacturing of the steel: at most 0.5% by weight, and the balance being Fe, characterized by a parent phase that is composed of an austenitic phase including 0–10% by volume of a ferritic phase at room temperature. The austenitic phase has the crystallinity of a single crystal, with composite carbides containing a carbon element in a range of 0.03–0.20% by weight, a part of the parent phase elements, and at least one of the added elements of Ti, Zr, V, Nb, and Ta is precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at room temperature.

Furthermore, the present invention relates to a precipitation hardening type single crystal austenitic steel having a preferable corrosion resistance composed of a parent phase with a chemical composition of:

Si: at most 1% by weight,

Mn: at most 2% by weight,

Mo: 1.0–4.0% by weight,

Ni: 10–15% by weight,

Cr: 14–18% by weight, unavoidable impurities in manufacturing of the steel: at most 0.5% by weight, and the balance being Fe, characterized by a parent phase that is composed of an austenitic phase including 0–10% by volume of ferritic phase at room temperature. The austenitic phase has the crystallinity of a single crystal, with composite carbides containing a carbon element in a range of 0.03–0.20% by weight, a part of the parent phase elements, and at least one of the added elements of Ti, Zr, V, Nb, and Ta is precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at room temperature.

The above described three kinds of precipitation hardening type single crystal austenitic steels relating to the present invention can contain Pd as a chemical composition. The amount of Pd contained in the steel is preferably in a range of 0.5–2.0% by weight.

The present invention relates to a manufacturing method for a single crystal of austenitic Cr—Ni type stainless steel reinforced with precipitated fine carbides. The manufacturing method comprises the steps of melting austenitic Cr—Ni type stainless steel containing carbon and at least one of Ti, Zr, V, Nb, and Ta for generating carbide of the metals, then solidifying the molten austenitic base material in one direction to obtain a single crystal, thermally treating the generated carbides for re-decomposing Cr carbide and the above carbide of metals generated in the course of cooling the single crystal in two steps (two steps decomposing heat treatment), the first step is at a temperature in a range of 1050°–1150° C. for carbides having a low-melting point, and the second step is at a temperature in a range of 1200°–1300° C. for carbides having a high melting point, subsequently cooling the single crystal rapidly, and again thermally treating the single crystal in a solid solution state for precipitating fine carbides in the austenitic single crystal base material (precipitation heat treatment).

The precipitated carbides occupy 5–20% in area of the material, and are at most 0.5 μm in diameter, preferably most of the carbides are within 0.02–0.3 μm in diameter, and at most 1 μm in length, preferably most of the carbides are within 0.1–0.8 μm in diameter. Crystallized carbides are at most 0.1 mm in width (preferably most of the carbides are within a range of 0.02–0.08 mm) and at most 0.5 mm in length, preferably most of the carbides are within a range of 0.02–0.25 mm.

The austenitic stainless steel having a single crystal austenitic phase, generated a by directional solidification relating to the present invention, has a yield strength of 200–400 MPa, a tensile strength of 500–700 MPa, an elongation percentage of 25–50%, and a contraction percentage of 35–60% at room temperature.

The present invention relates to members for a nuclear reactor core, which are exposed to pure water at a high temperature and a high pressure and are irradiated with neutrons from nuclear fuel rods. The members are composed of precipitation hardening type single crystal austenitic steel having the above described chemical composition. The precipitation hardening type single crystal austenitic steel is composed of an austenitic phase including 0–10% by volume of ferritic phase, and the austenitic phase has the crystallinity of a single crystal, composite carbides containing carbon elements in a range of 0.03–0.20% by weight, a part of the parent phase elements, and at least one of the added elements of Ti, Zr, V, Nb, and Ta precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at a room temperature.

The present invention relates to members which are composed of a precipitation hardening type single crystal austenitic steel having the above described chemical composition. The precipitation hardening type single crystal austenitic steel is composed of an austenitic phase including 0–10% by volume of ferritic phase, and the austenitic phase has the crystallinity of a single crystal, composite carbides containing carbon elements in a range of 0.03–0.20% by weight, a part of the parent phase elements, and at least one of the added elements of Ti, Zr, V, Nb, and Ta, precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at room temperature.

The present invention relates to fastening members which are composed of a precipitation hardening type single crystal austenitic steel, having the above described chemical composition. The precipitation hardening type single crystal austenitic steel is composed of an austenitic phase including 0–10% by volume of ferritic phase, and the austenitic phase has the crystallinity of a single crystal, composite carbides containing carbon elements in a range of 0.03–0.20% by weight, a part of the parent phase elements, and at least one of the added elements of Ti, Zr, V, Nb, and Ta, precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at room temperature.

The present invention relates to nuclear reactor cores provided with upper grid plates and core support plates, wherein fastening members which are used for assembling the upper grid plates and the core support plates, fuel support brackets, and peripheral fuel support brackets, are composed of a precipitation hardening type single crystal austenitic steel with the above described chemical composition. The precipitation hardening type single crystal austenitic steel is composed of an austenitic phase including 0–10% by volume of ferritic phase, and the austenitic phase has the crystallinity of a single crystal, composite carbides containing carbon element in a range of 0.03–0.20% by weight, a part of the parent phase elements, and at least one of the added elements of Ti, Zr, V, Nb, and Ta, precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at room temperature.

The present invention relates to nuclear reactor cores provided with shrouds encircling nuclear fuel assemblies, wherein fastening members which are used for fixing the shrouds are composed of a precipitation hardening type single crystal austenitic steel with the above described chemical composition. The precipitation hardening type single crystal austenitic steel is composed of an austenitic phase including 0~10% by volume of ferritic phase, and the austenitic phase has the crystallinity of a single crystal, composite carbides containing carbon elements in a range of 0.03~0.20% by weight, a part of the parent phase elements, and at least one of the added elements of Ti, Zr, V, Nb, and Ta, precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at room temperature.

The present invention relates to a bolt-fastening repairing the method for repairing internal structures and apparatus of nuclear reactor cores having damaged portions which are inadequate for the integrity of the nuclear reactor. The bolts which are used for the bolt-fastening jigs in the repairing method for preventing ageing growth of the inadequate damaged portions and to maintain the strength of the peripheral portions of the reactor core, including the inadequate damaged portions, are composed of a precipitation hardening type single crystal austenitic steel with the above described chemical composition. The precipitation hardening type single crystal austenitic steel is composed of an austenitic phase including 0~10% by volume of ferritic phase, and the austenitic phase has the crystallinity of a single crystal, composite carbides containing carbon elements in a range of 0.03~0.20% by weight, a part of the parent phase elements, and at least one of the added elements of Ti, Zr, V, Nb, and Ta, precipitated by a solution heat treatment and a subsequent aging treatment in the parent phase in order to enhance the strength of the parent phase. The single crystal austenitic steel has a yield strength of at least 220 MPa by dispersing the composite carbides in the parent phase at room temperature.

The present invention aims at preventing grain boundary stress corrosion cracking of austenitic stainless steel, which is generated wherever a grain boundary exists, by grain boundary corrosion sensitization caused by the influence of welding heat under a non-irradiated condition, or by irradiation induced sensitization under a neutron irradiated condition. However, stress corrosion cracking is not generated in a structure wherein any grain boundaries connecting heterogeneous phases to each other do not exist, for instance, ferritic phases dispersed in the austenitic single phase. Therefore, a single crystal steel having an austenitic single phase can be an objective of investigation. A single crystal having the same parent phase structure as a polycrystalline crystal decreases in strength because of lack of grain boundaries, and the single crystal can not achieve its role when it is used, for instance, as a fastening member. The problem to be solved by the present invention is to improve the strength of the single crystal steel. In this regard, the strength of the single crystal steel can be improved by precipitating carbon and additive metals, which have previously been contained in the steel in a solid solution condition, in an adequate distributing state with a view toward improving the strength by a carbide precipitating reaction in a heat treatment after single crystallization. Furthermore, the precipitated carbide phase in a dispersion state has a function of quenching the point of the defect. The defect is generated by recoiling atoms under irradiation and then moves among lattices. Ageing embrittlement of the parent material can be prevented by avoiding accumulation of the defects.

As explained hereinafter, the inventors of the present invention evaluated carbide precipitated single crystal austenitic stainless steel by performing stress corrosion cracking tests under a high temperature and a high pressure water environment which simulates a corrosion environment in a nuclear reactor, as well as tensile strength tests, and simulated irradiation tests equivalent to neutron irradiation damage in a nuclear reactor core for 20 years operation. It was found that the carbide precipitated single crystal austenitic stainless steel has a preferable stress corrosion cracking resistance, an enhanced strength, and a superior irradiation resistance.

The single crystal having no successive grain boundaries can be prepared by the steps of melting austenitic stainless steel with an adjusted chemical composition, then directionally solidifying the molten stainless steel gradually, selecting one of the crystal grains which grow from the initial crystal growing plane, and growing crystal grains aligned in a direction along the selected crystal orientation.

The melting of the austenitic stainless steel is preferably performed at least at 1500° C. for ease in melting and at most at 1659° C. for controlling the reaction of the stainless steel with the casting die. In order to avoid contamination of the molten steel with gaseous elements in air, atmosphere around the molten steel is maintained at a reduced pressure of less than $3\times10^{-3}$ Torr or in an inert gas atmosphere, such as argon gas. The condition for solidifying the molten steel in one direction is such that the same atmosphere as that of melting is used for the same reason as stated above, and the solidifying speed is in a range of 1~50 cm/h. A solidifying speed of more than 50 cm/h makes it difficult to prepare a single crystal ingot for large size members, and a solidifying speed of less than 1 cm/h causes a defect due to a reaction of the molten steel with the casting die. Therefore, a solidifying speed equal to or more than 1 cm/h is preferable.

The single crystal, after the directional solidification, contains metallic carbides which have been precipitated and coagulated to form coarse grains during the solidification. However, the coarse grains do not have any advantageous effect in improving the strength. Therefore, a solution heat treatment for decomposing and making the coarse carbides a solid solution becomes necessary. The solution heat treatment preferably comprises the steps of annealing the carbide at a temperature in a range of 1050°~1150° C. below its melting point for 1~2 hours to give the carbide a low melting point, mainly Cr carbide, a solid solution, and subsequently annealing the carbide at a temperature in a range of 1200°~1300° C. for 2~5 hours to decompose residual complex carbides of Cr, Mo, Si, Ti, Zr, V, Nb, Ta and the like having a high melting point to make a solid solution. If the temperature during the solution heat treatment is higher than the melting point of the carbides, a void which can be seen in the structure of the solidified steel is generated. For precipitating carbides as hardening particles, an ageing treatment at a temperature in a range of 600°~900° C. for more than 16 hours and practically less than 30 hours after rapid cooling from the previous annealing at a higher temperature is preferable.

In accordance with the above ageing treatment, a yield strength of at least 220 MPa can be obtained by precipitating carbides with an average particle diameter smaller than submicrons with a number density of more than $10^{14}/cm^3$ or more than $200\times10^{-2}/\mu m^2$. The number density of the precipitated carbides is desirably $250~800\times10^{-2}/\mu m^2$, and preferably $270~540\times10^{-2}/\mu m^2$. The precipitated fine carbides preferably have an area fraction of 5~20%, at most 0.5 μm in diameter, and at most 1 μm in length. When a ratio of the amount of Nb and the amount of C, Nb/C, is less than 10, a ferritic phase is generated of at most 10%, and precipitated carbides of Nb, or Nb and Mo, of at most 1 mm wide and 0.5 mm long exist. The precipitated carbides are more preferable when they are as small as possible.

As explained above, irrespective of its generating mechanism, stress corrosion cracking starting from grain boundaries can be prevented by eliminating grain boundaries in the material. A single crystal with no grain boundaries causes a decrease in mechanical strength, but this decrease can be compensated by precipitating carbides with the solution heat treatment. The present invention aims at providing austenitic stainless steel with a high strength characteristics, by which generation of cracking is substantially prevented.

At least 14% of Cr content is necessary for enhancing the corrosion resistance, for forming the austenitic phase, and for preparing a large size single crystal material from the austenitic phase material. However, the addition of a large amount of Cr exceeding 20% causes embrittlement of the material because an s-phase is formed in the solidifying process of the single crystal.

Especially, 16~20% of Cr content, within a range of the stable austenitic phase, depending on the Ni content is desirable in consideration of a decrease of the Cr content, in the parent phase, in accordance with generation of chromium carbides and stabilization of the austenitic phase. Especially, a range of 17~19% is preferable.

At least 9% Ni is contained in the material to stabilize the austenitic phase and enhance corrosion resistance. An addition of a large amount of Ni to the material increases corrosion when the material is used, for instance, in a nuclear reactor by causing an electrochemical reaction at contact points with other members depending on the difference in the chemical composition under a same corrosion environment. In consideration of SUS 304, SUS 316 and their L material which are frequently used in a nuclear reactor, the Ni content of 9~21% is desirable in connection with the Cr content. Especially, 12~20.5% is preferable. Further, 12~14%, or 19~21% is more preferable.

Si and Mn are added to the material as deoxidizing agents, and Mn is added further as a desulfurizing agent. A Si content of at most 1 %, and a Mn content of at most 2% in the material is desirable in accordance with commercially available SUS 304, SUS 316. Especially, 0.05~0.35% for Si is preferable, and further, 0.05~0.15%, or 0.2~0.4% is more preferable. Especially, 0.01~1.5% for Mn is preferable, and further, 0.01~0.1%, or 0.5~1.5% is more preferable.

Mo is an essential element for increasing the corrosion resistance and enhancing the solid solution. It is necessary to add at least 1% Mo. However, the addition of Mo at more than 4% is not necessary because Mo can be a cause of forming an s-phase. Furthermore, Mo contributes to generation of complex carbides.

C is an essential element for forming metallic carbides. In order to prepare Cr carbide and at least one of the carbides among carbides of Ti, Zr, V, Nb, and Ta, for obtaining a yield strength of at least 220 MPa, at least 0.03% of the C content is desirable for the lower limit, and 0.2% of the C content is desirable for the upper limit. The content of 0.03% by weight equals approximately 0.4% or less in atomic weight, and 0.2% by weight equals approximately 1% in atomic weight. When the C content is less than 0.03%, most of the C is consumed in forming Cr carbides which readily become relatively coarse grain in aging, and the generated amount of other metal carbides decreases. When the C content is more than 0.2%, decreasing strength and elongation cause problems because coarse excess carbides are generated and grown. Especially, a range of 0.10~0.15% C is desirable.

Ti, Zr, V, Nb, and Ta are elements highly capable of generating carbides, and are necessary as enhanced precipitating agents in the present invention. The energy necessary for formation is lower in accordance with the above described order. The amount of elements to be added depends on the kind of at least one of the elements selected from the above group and the carbon content. For instance, if only one of the above five elements is added, an addition of the amount by weight for respective elements, Ti, Zr, V, Nb, and Ta, of approximately Ti:4×(C %), Zr:7.5×(C %), V:4×(C %), Nb:7.5×(C %), and Ta:13×(C %) is preferable. That means, 0.12~0.8% for Ti, 0.22~1.5% for Zr, 0.12~0.8% for V, 0.22~1.5% for Nb, and 0.39~2.6% for Ta is respectively preferable. Because the above respective elements form carbides with carbon in a ratio of one to one, the amount of the elements to be added is desirably somewhat less than an equivalent value to the C content in consideration of the consumption of carbon elements for forming Cr carbide.

Further, the preferable content of the elements can be adequately designated in atomic percentage (%) as $1<\{Ti(\%)+Zr(\%)+V(\%)+Nb(\%)+Ta(\%)\}/\{C(\%)+0.043\}<2$.

Pd is necessary for adding high corrosion resistance to the parent material containing Cr and Ni to enhance its function. In order to be effective, Pd must be contained to at least 0.5%, and the upper limit is 2.0%. The addition of more than 2.0% Pd influences the austenitic phase structure, and the corrosion resistance is increased by adding Pd more than 2.0%, which enhances corrosion of other members in the same manner as the excess adding of Ni. Therefore, a range of 0.4~1.5% is especially preferable.

The austenitic phase is a stable structure in the environment, and is necessary for obtaining a large size single crystal. The ferritic phase can exist at most at 10% in the austenitic phase, but a whole austenitic phase structure is desirable.

Plastic working at most at 5%, which is within a range of keeping a single crystal structure, can be added to the steel of the present invention. Further, the plastic working is applicable when the respective heat treatments can be more effective by adding the plastic working before the solution heat treatment and/or the aging heat treatment.

The steel of the present invention has a yield strength of 200~400 MPa, a tensile strength of 500~700 MPa, an elongation percentage of 25~50%, and a contraction percentage of 35~60% at room temperature. Especially, the steel of the present invention has characteristics of yield strength of 250~450 MPa, tensile strength of 550~650 MPa, elongation percentage of 30~42%, and contraction percentage of 35~56% at room temperature.

The steel of the present invention is used not only in nuclear reactor cores, but also in a water-cooled environment or a hydrogen-existing environment, similar to structural materials which receive radiation-irradiated damage, especially for bracket cooling tubes for a nuclear fusion reactor first wall and shell. Generally, the steel is used for strong members which are used under an environment wherein grain boundaries mainly cause deterioration of the material.

BRIEF DESCRIPTION OF THE DRAWINGS

FIG. 8 is an enlarged partial plan view of the upper grid plate of the nuclear reactor core;

FIG. 9 is an enlarged detail view taken from the IX portion of FIG. 8;

FIG. 10 is an enlarged detail view taken from the X portion of FIG. 8;

DETAILED DESCRIPTION OF THE EMBODIMENTS

Embodiment 1

Figure 1:
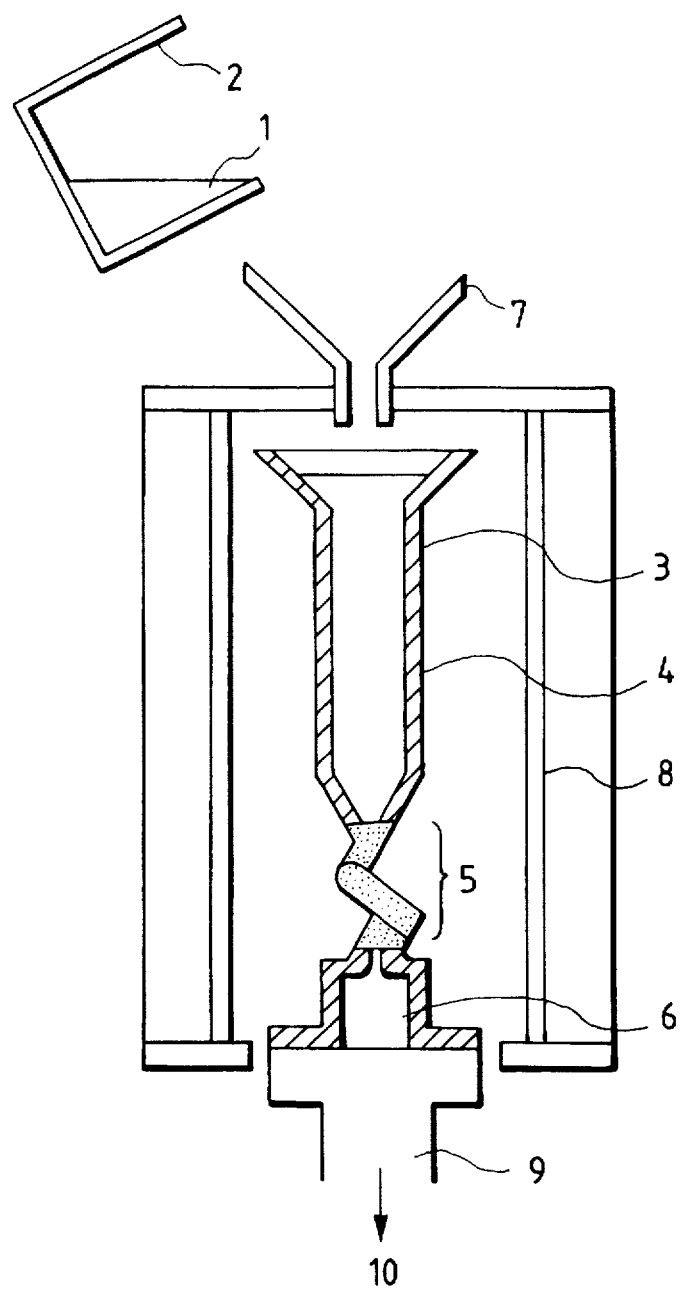
FIG. 1 is a schematic vertical cross section indicating a composition of a manufacturing apparatus for a precipitation hardening type austenitic stainless steel, which is one of embodiments of the present invention.

Referring to FIG. 1, an embodiment of the method of manufacturing a precipitation hardening type single crystal austenitic steel relating to the present invention will be explained hereinafter.

The apparatus indicated in FIG. 1 comprises a high frequency melting furnace 2 for preparing molten metal 1, a casting die 3, a body 4, a selector 5, a starter 6 which is placed on a water-cooled chill 9, and casting die super heater 8 provided with a casting inlet 7 covering the above casting die 3, the body 4, the selector 5, and the starter 6. The casting die 3 was fixed on the water-cooled chill 9, the casting die 3 was super-heated to 1550° C. by the casting die super heater 8, and austenitic stainless steel containing carbon and carbides, generating metals shown in Table 1, was melted to molten metal 1 by the high frequency melting furnace 2 and cast in the casting die 3 through the casting inlet 7.

In Table 1, a result of analysis of single crystals of 12 steel species which were treated with final heat treatment according to the present invention is shown.

The casting temperature was 1550° C., the body 4 was maintained at 1150° C. for 5 minutes after the casting, subsequently the water-cooled chill 9 was moved downward in the direction of arrow 10, and finally the casting die 3 was withdrawn from the casting die super heater 8 so that the molten metal 1 in the body 4 was solidified in one direction from the water-cooled chill 9 side. At that time, the casting die super heater 8 was maintained at 1550° C. until the solidification in one direction was finished. The withdrawing velocity of the casting die was kept at a constant rate, 15 cm/h, and the molten metal in the body 4 was maintained in an atmosphere of reduced pressure, $8 \times 10^{-3}$ Torr. After the casting, many crystals were generated in the starter 6. However, as the casting die 3 was withdrawn downward, solidification of the crystals proceeded gradually, of the crystals only one crystal was selected during solidifying in the selector 5, and a single crystal was obtained from the molten metal in the body 4.

TABLE 1

| Steel sp. No. | Chemical composition (% by weight) Balance in all species is Fe. | | | | | | | | | | | | |
|---|---|---|---|---|---|---|---|---|---|---|---|---|---|
| | C | Si | Mn | P | S | Ni | Cr | Mo | Pd | Ti | Zr | V | Nb | Ta |
| 1 | 0.114 | 0.085 | 0.026 | 0.032 | 0.017 | 20.41 | 17.42 | — | — | — | — | — | 0.925 | — |
| 2 | 0.152 | 0.091 | 0.019 | 0.032 | 0.021 | 20.12 | 17.27 | — | 0.943 | 0.615 | — | — | — | — |
| 3 | 0.149 | 0.33 | 1.28 | 0.030 | 0.019 | 12.06 | 18.52 | — | — | — | — | — | 1.08 | — |
| 4 | 0.151 | 0.28 | 1.21 | 0.032 | 0.022 | 12.32 | 18.14 | — | 1.260 | 0.639 | — | — | — | — |
| 5 | 0.136 | 0.36 | 1.21 | 0.030 | 0.016 | 12.18 | 18.62 | — | — | — | — | 0.581 | — | — |
| 6 | 0.119 | 0.32 | 1.19 | 0.033 | 0.020 | 12.21 | 18.13 | — | 0.476 | — | — | — | — | — |
| 7 | 0.144 | 0.31 | 1.26 | 0.031 | 0.022 | 13.35 | 17.02 | 2.61 | — | — | — | — | 1.12 | — |
| 8 | 0.182 | 0.33 | 1.22 | 0.028 | 0.021 | 12.66 | 17.32 | 2.73 | 0.643 | 0.773 | — | — | — | — |
| 9 | 0.154 | 0.38 | 1.28 | 0.032 | 0.019 | 13.05 | 17.39 | 2.31 | — | 0.433 | — | — | — | 2.23 |
| 10 | 0.141 | 0.28 | 1.28 | 0.032 | 0.022 | 12.66 | 17.51 | 2.48 | — | — | 0.972 | — | — | — |
| 11 | 0.137 | 0.31 | 1.28 | 0.032 | 0.023 | 12.66 | 17.67 | 2.83 | 0.722 | — | — | — | 1.06 | — |
| 12 | 0.161 | 0.27 | 1.28 | 0.032 | 0.018 | 12.66 | 17.92 | 2.13 | — | 0.24 | 0.327 | — | — | 0.59 |

In accordance with the above method, a single crystal of 20 mm in diameter and 20 cm long, and a single crystal of 15 mm thick, 70 mm wide, and 120 cm long were obtained depending on the capacity of the casting die 3. The existence of the single crystal was confirmed by a micro-etching technique. Casting products wherein an austenitic phase was composed of a single crystal could be prepared from all of the steel species shown in Table 1.

At the time of preparation, even if the casting temperature was designated as 1650° C., there was no problem for obtaining a single crystal. If the atmosphere was replaced with inert argon gas, there was no influence on preparation of the single crystal. Even if the casting die withdrawing velocity was varied to 1 cm/h or 50 cm/h in cases of the steel species No. 17 and 10, single crystals were obtained as well.

However, coarsely crystallized carbides or precipitated phases other than the carbides composed of Ti, Zr, V, Nb, and Ta, both of which are assumed to be formed at the time of solidification, are formed generally as a network in all of the steel species. For instance, the steel species No. 7 which contains Nb forms coarse carbides as a network. The carbides hardly contribute to the mechanical strength of the steel as described later.

Next, a fining process of the steel species by solution heat treatment will be explained. In order to decompose the coarse carbides and precipitated phases and to make them a solid solution, a solution heat treatment at a temperature range of 1200°~1250° C. was performed for 2~24 hours. The microstructure indicated that all of the steel species shown in Table 1 had undecomposed carbides in response to a solution heat treatment for 2~5 hours, and voids were observed in the parent phase. The undecomposed carbides disappeared in response to a solution heat treatment for more than 6 hours, but the void density was increased. Generation of voids is undesirable in view of the mechanical strength of the material. It is considered that generation of voids is due to the carbides or the precipitated phases composed of mainly Cr having a low melting point which are previously formed in the solidification melt in the annealing process, and which remain as voids after cooling. Accordingly, a first solution heat treatment at a temperature in a range of 1050°~1150° C. was performed for 60 hours in order to decompose the carbides or the precipitated phases having a low melting point completely, and subsequently, a second solution heat treatment at a temperature in a range of 1200°~1300° C. was performed for 2~5 hours in order to decompose the carbides having a high melting point and to make them a solid solution. Substantially, the above solution heat treatment condition varied depending on respective steel species as shown in Table 2 for making residual carbides or the precipitated phases 1% or less in a fraction of the cross sectional occupying area.

Figure 2:
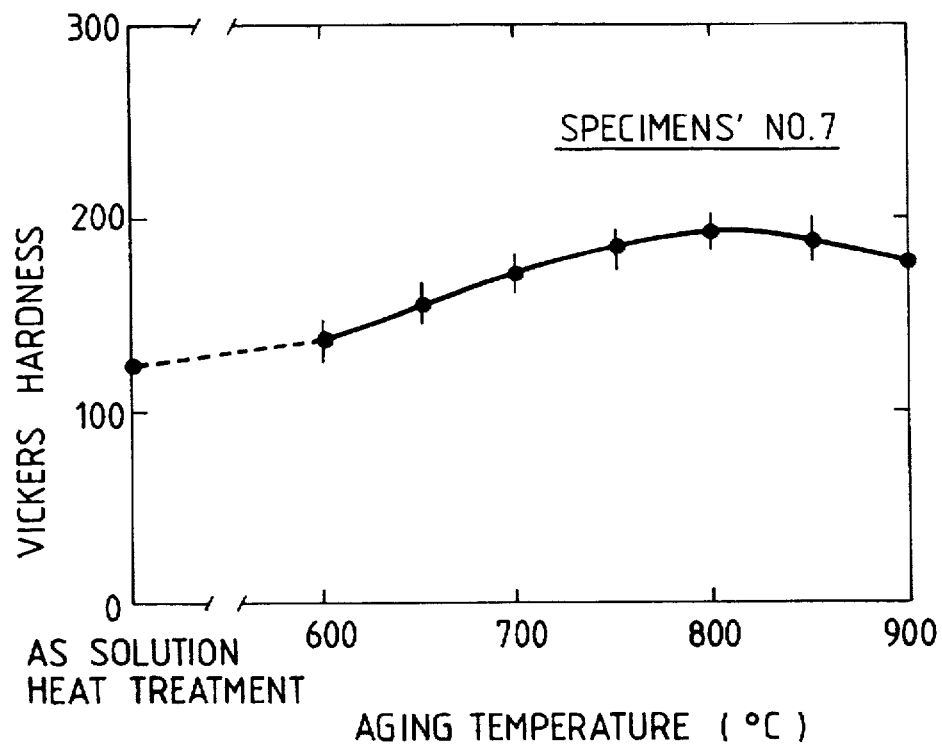
FIG. 2 is a graph indicating a variation of Vickers hardness depending on aging temperatures of the steel species No. 7, which is one of the embodiments of the present invention.

An ageing treatment for precipitation from the solid solution condition was performed on all the steel species at a temperature of every 50° C. in a range of 600°~900° C. for 16 hours. In order to find an ageing condition which gives the maximum mechanical strength, a hardness test was performed on samples which were treated by the ageing treatment at various temperature. A relationship between the ageing temperatures and Vickers hardness of the steel species No. 7 is shown in FIG. 2. It was confirmed that the sample treated with ageing at 800° C. which showed the maximum hardness had rod shaped complex carbides which had a crystal orientation, a submicron size, and a distribution with submicron intervals by 330-470×10$^{-2}$ pieces/μm$^2$, and the precipitated carbides had a fraction of cross sectional occupying area of about 12%. Analysis with a EPMA and a TEM revealed that the complex carbides were composed of Nb, Cr, Mo, Si, and the like. The precipitated carbides were at most 0.5 μm in diameter, mostly 0.02~0.3 μm, and at most 1 μm long, mostly 0.1~0.8 μm. The crystallized carbides had a fraction of cross sectional occupying area of about 6%, and were at most 0.1 mm wide, mostly 0.01~0.08 mm, and at most 0.5 mm long, mostly less than 0.02~0.25 mm.

The solution heat treatment shown in Table 2 and the ageing heat treatment obtaining the maximum hardness were performed on all of the 12 steel species, samples for tensile test of parallel portion 16 mm long and 5 mm in diameter were prepared, and tensile tests were performed with nominal strain velocity of 2.1×10$^{-4}$ (/second). The results of the tensile tests are shown in Table 3. In the Table 3, the steel species numbers attached with the * mark such as No.1*, 4*, and 7* are the results on single crystal steels without any ageing treatment.

TABLE 2

| Steel species No. | First solution heat treatment | | Second solution heat treatment | |
|---|---|---|---|---|
| | Temperature (°C.) | Hours (h) | Temperature (°C.) | Hours (h) |
| 1 | 1150 | 60 | 1250 | 3 |
| 2 | 1150 | 60 | 1250 | 3 |
| 3 | 1100 | 60 | 1250 | 3 |
| 4 | 1150 | 60 | 1250 | 3 |
| 5 | 1150 | 60 | 1270 | 5 |
| 6 | 1100 | 60 | 1250 | 3 |
| 7 | 1150 | 60 | 1250 | 3 |
| 8 | 1150 | 60 | 1250 | 3 |
| 9 | 1150 | 60 | 1270 | 5 |
| 10 | 1150 | 60 | 1270 | 5 |
| 11 | 1100 | 60 | 1250 | 3 |
| 12 | 1150 | 60 | 1270 | 5 |

TABLE 3

| Steel species No. | 0.2% Yield strength (MPa) | Tensile strength (MPa) | Elongation (%) | Contraction (%) |
|---|---|---|---|---|
| 1 | 306 | 582 | 39.6 | 51.0 |
| 2 | 337 | 617 | 34.3 | 56.0 |
| 3 | 291 | 587 | 37.2 | 49.0 |
| 4 | 283 | 586 | 30.9 | 37.5 |
| 5 | 322 | 595 | 31.7 | 46.0 |
| 6 | 264 | 560 | 37.0 | 49.0 |
| 7 | 292 | 594 | 37.5 | 48.0 |
| 8 | 306 | 581 | 34.0 | 46.0 |
| 9 | 274 | 562 | 39.1 | 50.5 |
| 10 | 318 | 621 | 33.4 | 51.0 |
| 11 | 256 | 571 | 40.8 | 42.0 |
| 12 | 349 | 618 | 32.7 | 48.5 |
| 1* | 184 | 191 | 80.5 | 38.0 |
| 4* | 170 | 178 | 62.0 | 56.0 |
| 7* | 162 | 166 | 58.5 | 49.0 |

Figure 3:
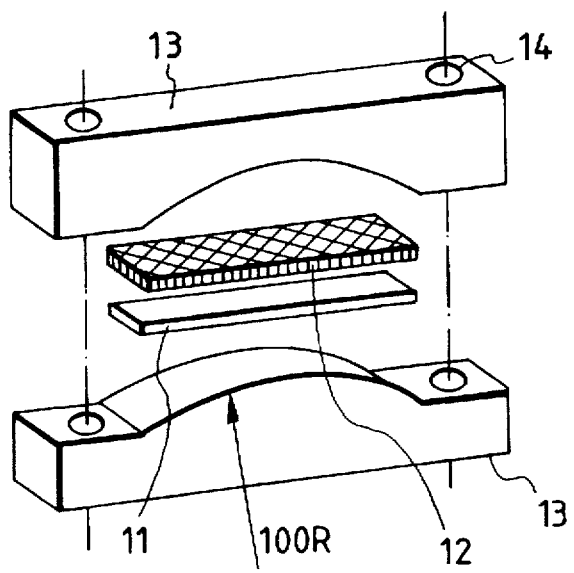
FIG. 3 is a perspective drawing indicating a testing method for stress corrosion cracking.

Test pieces of 2 mm thick, 10 mm wide, and 50 mm long were prepared from a carbide dispersed single crystal austenitic steel of 15 mm thick, 70 mm wide, and 120 mm long, which was prepared by the above described process, and a CBB test which was effective for stress corrosion cracking was performed with commercially available SUS 316 and SUS 304 steel. Previously, sensitizing heat treatment was performed on the above described test pieces at 620° C. for 24 hours. FIG. 3 is a perspective view indicating a method for the CBB test. The test piece 11 was held in an span of the holder 13 with graphite fiber wool 12, which provided a gap to the test piece 11, bolts were inserted into the holes 14 respectively, the test piece was fastened tightly in the span of the holder 13 with a curvature by the bolts, and the holder 13 with the test piece 11 was placed in an autoclave for a stress corrosion cracking test. The test condition was such that the test piece was immersed into water of high temperature, 288° C., and high pressure, 85 kg/cm$^2$ (dissolved amount of oxygen 8 ppm), for 500 hours. Subsequently, the test piece 11 was taken out from the autoclave, and generation of cracks was determined by observation on the cross section of the test piece 11. Many cracks of 1~2 mm deep were observed on the SUS 316 and SUS 304 steel test pieces. On the contrary, no cracks were observed on all single crystal steel relating to the present invention, and high corrosion resistance of the single crystal steel relating to the present invention was confirmed.

Embodiment 2

Figure 4:
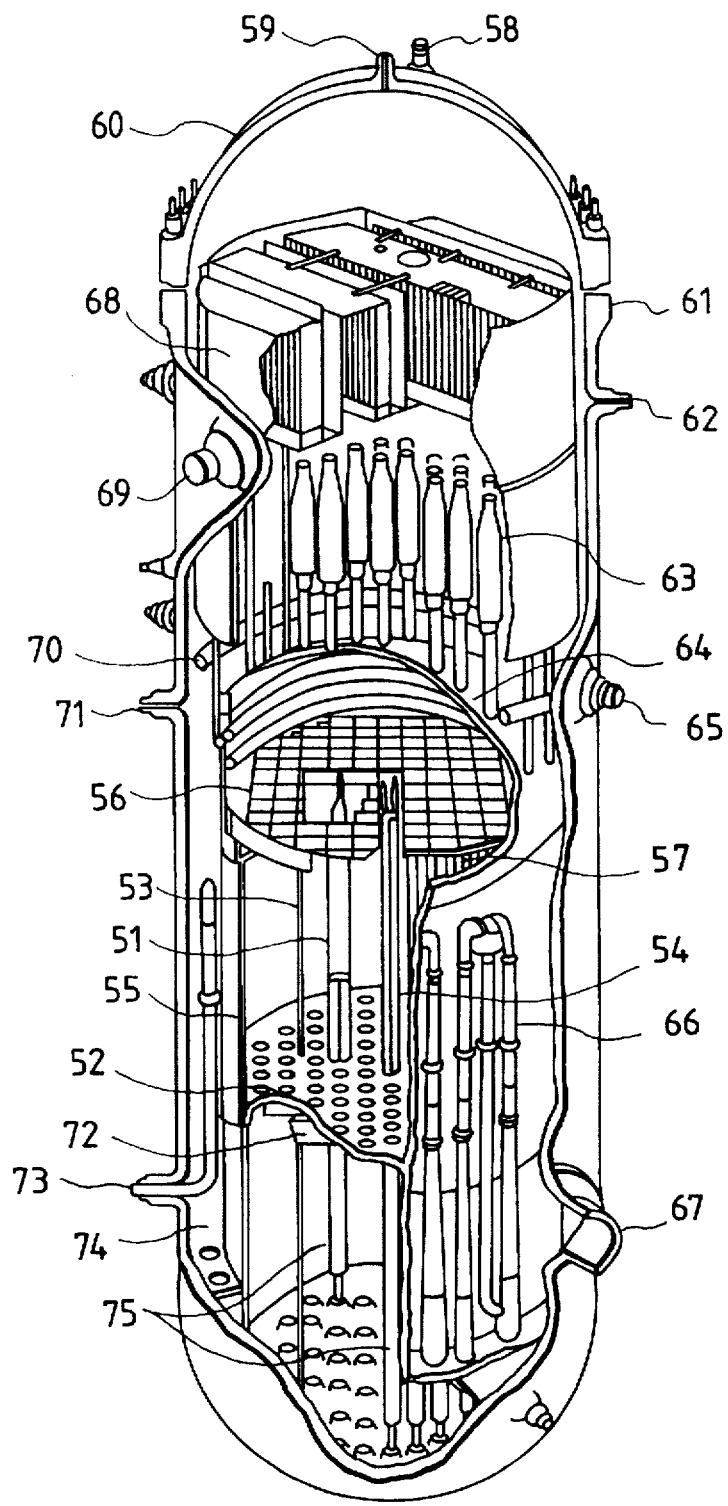
FIG. 4 is a perspective partial cross sectional view of a nuclear reactor core indicating an embodiment using the austenitic steel of the present invention.

After the steel species No. 7 of austenitic single crystal stainless steel prepared by the embodiment 1 of the present invention was heat treated under the above described condition. various structural members of a boiling water nuclear reactor shown in FIG. 4 were manufactured with the austenitic single crystal stainless steel. The nuclear water is operated with steam of a temperature at 286° C. and a pressure of 70.7 atg. is able to generate electric power of 500, 800, 100 MW as an output. The respective members of the reactor are as follows: 51 ... poison curtain, 52 ... core support plate, 53 ... neutron detecting instrument tube, 54 ... control rod, 55 ... core shroud, 56 ... upper grid plate, 57 ... fuel assembly, 58 ... upper end plate spray nozzle, 59 ... bent nozzle, 60 ... pressure vessel lid, 61 ... flange, 62 ... instrumentation nozzle, 63 ... water/steam separator, 64 ... shroud head, 65 ... feed water inlet nozzle, 66 ... jet pump, 68 ... steam dryer, 69 ... steam outlet nozzle, 70 ... feed water sparger, 71 ... core spray nozzle, 72 ... lower core grid, 73 ... circulating water inlet nozzle, 74 ... baffle plate, 75 ... control rod guide tube.

The upper grid plate 56 comprises a rim body 21, flanges 22, and grid plates 35 which are made of a polycrystalline rolled material of SUS 316 steel. The grid plates 35 only intersect each other and are not fixed each other. The core support plate 52 is made of a polycrystalline rolled material of SUS 316 steel, manufactured from a sheet of rolled plate, in which holes for fixing fuel support brackets are provided, and the plate 52 is fixed to the reactor vessel at its peripheral portion. Accordingly. the above described members have no welding portions at a central portion which receives neutron irradiation.

Figure 5:
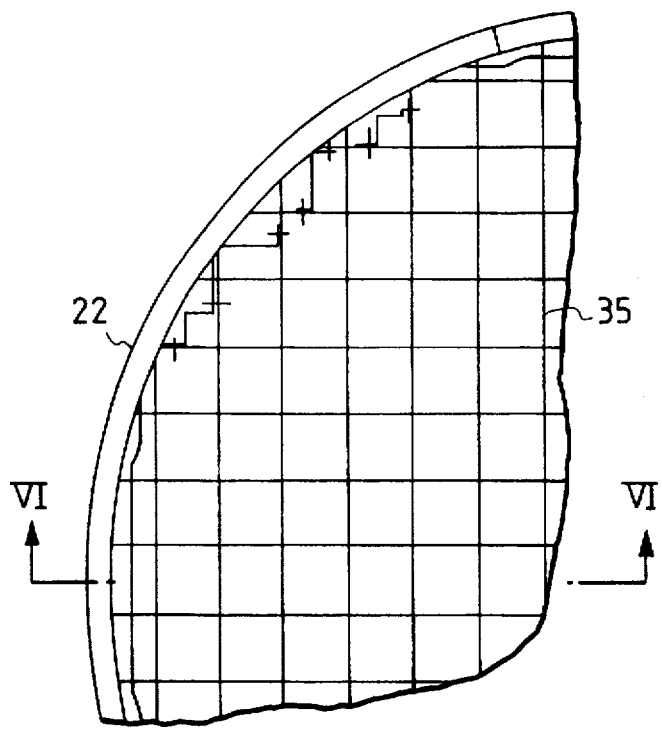
FIG. 5 is a schematic partial plan view of an upper grid plate of the nuclear reactor core.
Figure 7:
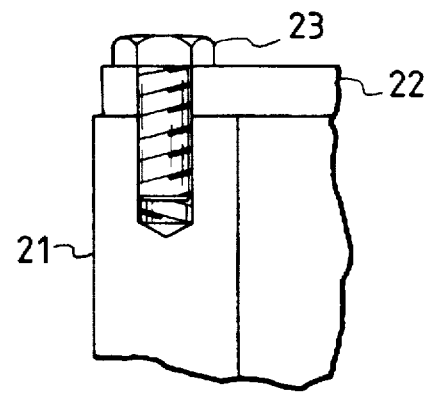
FIG. 7 is an enlarged detail view taken from the VII portion of FIG. 6.
Figure 6:
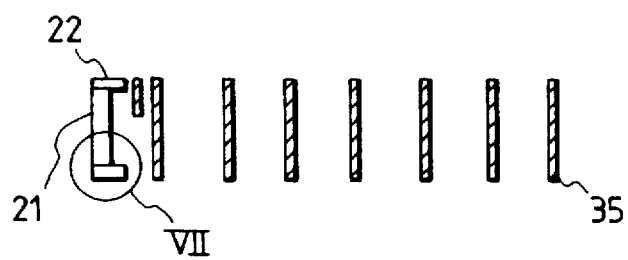
FIG. 6 is a vertical cross sectional view taken along the line VI—VI of FIG. 5.

FIG. 5 is a partial plan view of the upper grid plate. FIG. 6 is a cross sectional view taken along the line VI—VI in FIG. 5, and FIG. 7 is a partial enlarged cross sectional view of the VI portion in FIG. 6. The above described alloy relating to the present invention was applied to the bolt 23 shown in FIG. 7. The bolt 23 of the present invention was used for fixing the rim body 21 and the upper flange 22, and the screw was manufactured by cutting a rod shaped material.

FIG. 8 is a partial enlarged view of the upper grid plate, FIG. 9 is a partial enlarged view of the IX portion in FIG. 8, and FIG. 10 is a partial enlarged view of the X portion in FIG. 8. Bolts and nuts for fastening and fixing the grid plate 31 and the support plate 32 of the upper grid plate 56, and the bolts 36 and the nuts 37 for fastening the grid plate 31 and the support plate 32, and the support plate 32 and the grid plate 35 were manufactured from a single crystal as well as the above.

Figure 11:
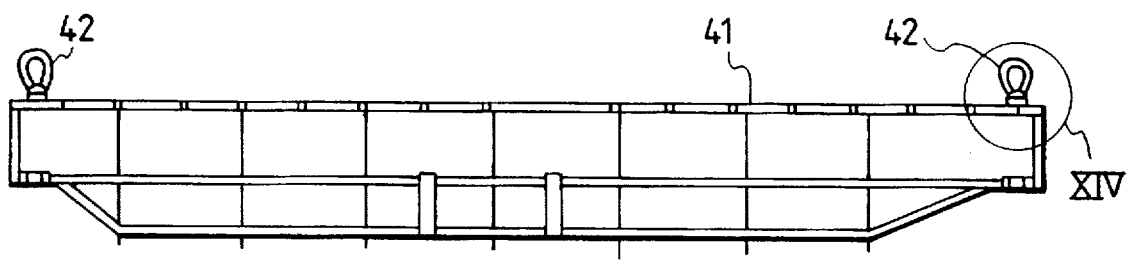
FIG. 11 is a perspective view of a core supporting plate in the nuclear reactor core.
Figure 12:
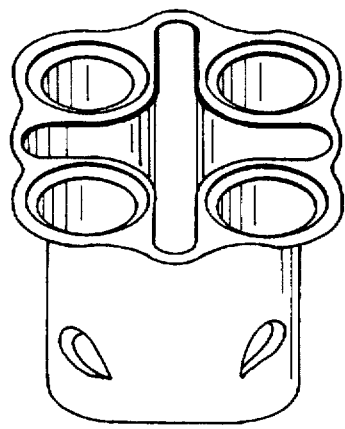
FIG. 12 is a perspective view of a fuel supporting bracket in the nuclear reactor core.
Figure 13:
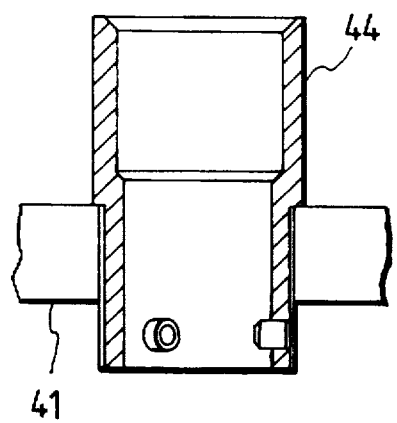
FIG. 13 is a cross sectional view of a peripheral fuel supporting bracket in the nuclear reactor core.
Figure 14:
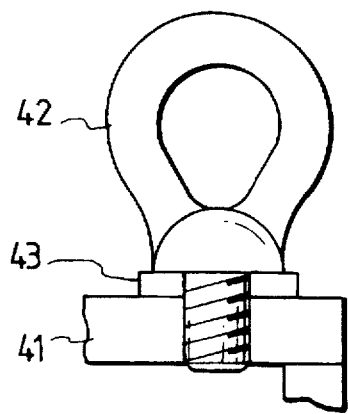
FIG. 14 is an enlarged detail view taken from the XIV portion of FIG. 11.

FIG. 11 is a schematic cross sectional view of a core supporting plate 52, and the core supporting plate was provided with fuel supporting brackets shown in FIG. 12, peripheral fuel supporting brackets shown in FIG. 13, eye bolts 42 and washers 43 shown in FIG. 14, and the like. FIG. 14 is a partial enlarged view of the XIV portion in FIG. 11. The above described fuel supporting bracket, peripheral fuel supporting bracket, eye bolt 42, and washer 43 as shown in FIGS. 12-14 were prepared from the above described single crystal austenitic steel of the present invention.

The above described members, manufactured by the method of the present invention, were irradiated with neutrons by $1 \times 10^{22}$ n/cm$^2$ (>1 MeV) under a condition simulated in a boiling water nuclear reactor. As a result, no irradiation induced stress corrosion cracking was observed on any bolts or nuts. In accordance with this result, the upper grid plate and the core support plate are assumed to be capable of operating for 40 years without need for replacing. Especially, it is important to compose members, which are used at portions which receive neutron irradiation as much as $2 \times 10^{22}$ n/cm$^2$ (>1 MeV) and high stresses, as the bolts and nuts, and of which represent a surface invisible directly from the outside, with material having high stress corrosion cracking resistance.

Embodiment 3

Next, an embodiment concerning repairing in accordance with the present invention will be explained hereinafter.

Figure 15:
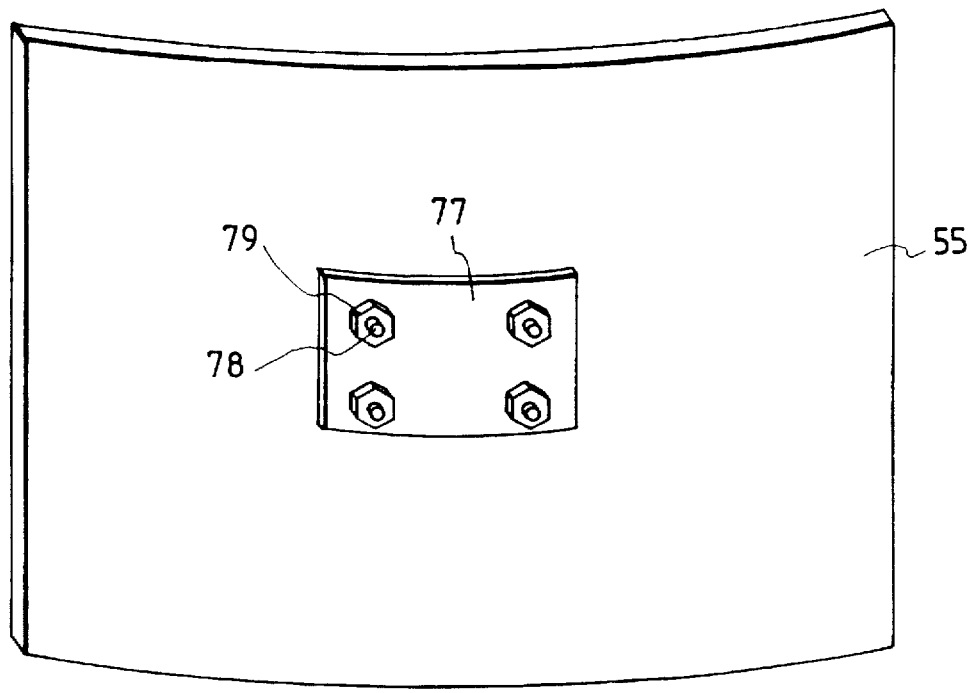
FIG. 15 is a perspective partial view of a shroud indicating a repairing method for a defected portion of the shroud.

FIG. 15 indicates an example of the repairing state of a structural material for a boiling water nuclear reactor core. As a damaged portion was generated in a core shroud 55 by stress corrosion cracking, a clamp 77 in the form of a reinforcing plate for protecting and reinforcing mechanically, was fixed to the core shroud 55 for repairing by the repairing bolts 78 and the repairing nuts 79. In this case, the clamp 77, the repairing bolts 78, and the repairing nuts 79 were made of an austenitic stainless steel single crystal of the present invention.

Figure 16:
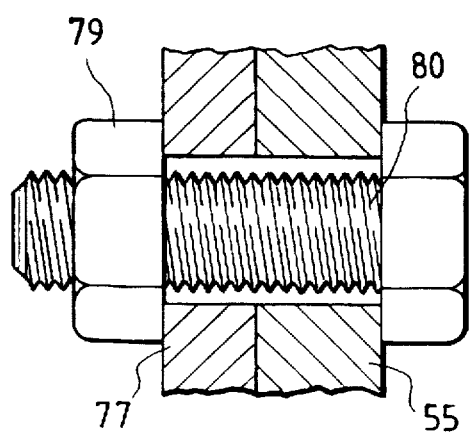
FIG. 16 is a cross sectional view of a portion repaired with a taperless bolt which is an embodiment of the present invention.
Figure 17:
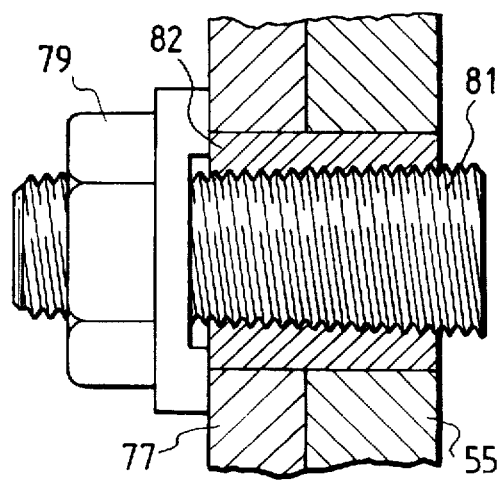
FIG. 17 is a cross sectional view of a portion repaired with a tapered bolt, which is an embodiment of the present invention.

The tie of the core shroud 55 and the clamp 77 was fastened with a taperless bolt 80 and the repairing nut 79 as shown in FIG. 16. In other cases, the tie of the core shroud 55 and the clamp 77 was fastened with a tapered bolt 81, the repairing nut 79, and a sleeve with slits 82, as shown in FIG. 17. In this case, the clamp 77, the repairing nuts 79, the taperless bolt 80, the tapered bolt 81, and the sleeve with slits 82 were made of an austenitic stainless steel single crystal of the present invention.

In accordance with the present embodiment, life of the boiling water nuclear reactor can be extended by repairing various core structure of the nuclear reactor with repairing members having preferable stress corrosion cracking resistance. Further, as the repairing members have a similar or approximately the same composition to material of surrounding structural members, the electric potential in high temperature pure water becomes equal. Fine precipitated carbides exist in the single crystal made by the method disclosed in accordance with the present invention. As grain boundaries of the carbides and the parent phase operate as annihilation points of irradiation defects the same as crystal grain boundaries, an accumulation of the irradiation defects in the parent phase can be suppressed, and a large advantage for suppressing so-called irradiation induced embrittlement, creep under irradiation can be realized.

In the present embodiment, the bolts, the nuts, and the clamp were made of a single crystal. However, manufacturing the grid plate 35 of the upper grid plate, the core support plate 52, the support plate 32, and neutron detecting instrumentation tubes 53 with the same single material of the present invention as the bolts and the nuts is also significantly advantageous.

In accordance with the present invention, generation of irradiation induced grain boundary-type stress corrosion cracking in structural members made of austenitic stainless steel, which are used in a radiation irradiated environment, such as a nuclear reactor core, can be prevented. Therefore, the life of structural members in nuclear reactor cores, and the first walls and blanket structural members of nuclear fusion reactors can be extended to make the nuclear reactor operable for more than 40 years, and the safety and reliability of the nuclear fusion reactors can be improved significantly.

What is claimed is:

1. Precipitation hardening type austenitic stainless steel having a stress corrosion cracking resistance which contains:

C: 0.03–0.20 & by weight.

Si: max. 1% by weight,
Mn: max. 2.0% by weight,
Ni: 9–21% by weight,
Cr: 14–20% by weight, and
unavoidable impurities: max. 0.5% by weight;
wherein
  said steel comprises an austenitic-ferritic phase including ferritic phases which are at most 10% by volume, or all austenitic phase, as a parent phase;
  said austenitic phase is a single crystal; and
  carbides have been substantially formed in an ageing heat treatment and are precipitated in the parent phase.

2. Precipitation hardening type austenitic stainless steel having a stress corrosion cracking resistance which contains:
C: 0.03–0.20 & by weight,
Si: max. 1% by weight,
Mn: max. 2.0% by weight,
Ni: 9–21% by weight,
Cr: 14–20% by weight,
Pd: 0.5–2.0% by weight, and
unavoidable impurities: max. 0.5% by weight;
wherein
  said steel comprises an austenitic-ferritic phase including ferritic phases which are at most 10% by volume, or all austenitic phase, as a parent phase;
  said austenitic phase is a single crystal; and
  carbides have been substantially formed in an ageing heat treatment and are precipitated in the parent phase.

3. Precipitation hardening type austenitic stainless steel having a stress corrosion cracking resistance which contains:
C: 0.03–0.20 & by weight,
Si: max. 1% by weight,
Mn: max. 2.0% by weight,
Ni: 9–21% by weight,
Cr: 14–20% by weight,
Mo: 1–4.0% by weight, and
unavoidable impurities: max. 0.5% by weight;
wherein
  said steel comprises an austenitic-ferritic phase including ferritic phases which are at most 10% by volume, or all austenitic phase, as a parent phase;
  said austenitic phase is a single crystal; and
  carbides have been substantially formed in an ageing heat treatment and are precipitated in the parent phase.

4. Precipitation hardening type austenitic stainless steel having a stress corrosion cracking resistance which contains:
C: 0.03–0.20 & by weight,
Si: max. 1% by weight,
Mn: max. 2.0% by weight,
Ni: 9–21% by weight,
Cr: 14–20% by weight,
Mo: 1–4.0% by weight,
Pd: 0.5–2.0% by weight, and
unavoidable impurities: max. 0.5% by weight;
wherein
  said steel comprises an austenitic-ferritic phase including a ferritic phases which is at most 10% by volume, or all austenitic phase, as a parent phase;
  said austenitic phase is a single crystal; and
  carbides have been substantially formed in an ageing heat treatment and are precipitated in the parent phase.

5. Precipitation hardening type austenitic stainless steel having a stress corrosion cracking resistance which contains:
C: 0.03–0.20 & by weight,
Si: max. 1% by weight,
Mn: max. 2.0% by weight,
Ni: 9–21% by weight,
Cr: 14–20% by weight,
at least one element selected from Ti, Zr, V, Nb, and Ta which are defined in atomic percentage as $1<\{Ti(\%)+Zr(\%)+V(\%)+Nb(\%)+Ta(\%)\}/\{C(\%)+0.043\}<2$, and
unavoidable impurities: max. 0.5% by weight;
wherein
  said steel comprises an austenitic-ferritic phase including ferritic phases which are at most 10% by volume, or all austenitic phase, as a parent phase;
  said austenitic phase is a single crystal; and
  carbides have been substantially formed in an ageing heat treatment and are precipitated in the parent phase.

6. Precipitation hardening type austenitic stainless steel having a stress corrosion cracking resistance which contains:
C: 0.03–0.20 & by weight,
Si: max. 1% by weight,
Mn: max. 2.0% by weight,
Ni: 9–21% by weight,
Cr: 14–20% by weight,
at least one element of Mo: 1–4.0% by weight and
Pd: 0.5–2.0% by weight,
at least one element selected from Ti, Zr, V, Nb, and Ta which are defined in atomic percentage as $1<\{Ti(\%)+Zr(\%)+V(\%)+Nb(\%)+Ta(\%)\}/\{C(\%)+0.043\}<2$, and
unavoidable impurities: max. 0.5% by weight;
wherein
  said steel comprises an austenitic-ferritic phase including a ferritic phases which is at most 10% by volume, or all austenitic phase, as a parent phase;
  said austenitic phase is a single crystal; and
  carbides have been substantially formed in an ageing heat treatment and are precipitated in the parent phase.

7. Precipitation hardening type austenitic stainless steel as claimed in any one of claims 1 to 6, wherein
  said steel contains fine carbides by 5–20% in a fraction of a cross sectional occupying area.

8. Precipitation hardening type austenitic stainless steel as claimed in any one of claims 1 to 6, wherein the austenitic steel has a yield strength of at least 220 MPa.

9. Precipitation hardening type austenitic stainless steel as claimed in claim 7, wherein the precipitated carbides have a maximum diameter of 0.5 μm.

* * * * *